United States Patent
Kawase et al.

(10) Patent No.: US 9,673,308 B2
(45) Date of Patent: Jun. 6, 2017

(54) SEMICONDUCTOR DEVICE MANUFACTURING METHOD

(71) Applicant: Mitsubishi Electric Corporation, Tokyo (JP)

(72) Inventors: Yusuke Kawase, Tokyo (JP); Kazunori Kanada, Fukuoka (JP); Tadaharu Minato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/031,623

(22) PCT Filed: Dec. 13, 2013

(86) PCT No.: PCT/JP2013/083458
§ 371 (c)(1),
(2) Date: Apr. 22, 2016

(87) PCT Pub. No.: WO2015/087439
PCT Pub. Date: Jun. 18, 2015

(65) Prior Publication Data
US 2016/0254372 A1 Sep. 1, 2016

(51) Int. Cl.
*H01L 29/739* (2006.01)
*H01L 21/04* (2006.01)
(Continued)

(52) U.S. Cl.
CPC ...... *H01L 29/7395* (2013.01); *H01L 21/0415* (2013.01); *H01L 21/324* (2013.01);
(Continued)

(58) Field of Classification Search
CPC H01L 29/7395; H01L 21/0415; H01L 21/324
(Continued)

(56) References Cited

U.S. PATENT DOCUMENTS 6,482,681 B1  11/2002 Francis et al.
2006/0286753 A1  12/2006 Barthelmess et al.
(Continued)

FOREIGN PATENT DOCUMENTS

JP  2001-077357 A  3/2001
JP  2004-247593 A  9/2004
(Continued)

OTHER PUBLICATIONS

Notification of Transmittal of Translation of the International Preliminary Report on Patentability and Translation of Written Opinion of the International Searching Authority; PCT/JP2013/083458 issued on Jun. 23, 2016.
(Continued)

*Primary Examiner* — Errol Fernandes
(74) *Attorney, Agent, or Firm* — Studebaker & Brackett PC (57) ABSTRACT

According to the present invention, since the buffer layer is formed by multiple ion implantations of different acceleration energies and the non-diffusion region in which impurity do not diffuse is left between the buffer layer and the collector layer, the semiconductor device which can supply sufficient holes to the drift layer at the turn-off can be manufactured while the withstand voltage is ensured.

6 Claims, 5 Drawing Sheets

(51) Int. Cl.
  *H01L 29/66* (2006.01)
  *H01L 29/08* (2006.01)
  *H01L 21/324* (2006.01)
  *H01L 21/265* (2006.01)
  *H01L 29/167* (2006.01)

(52) U.S. Cl.
  CPC ...... *H01L 29/0821* (2013.01); *H01L 29/0847* (2013.01); *H01L 29/66333* (2013.01); *H01L 21/26513* (2013.01); *H01L 29/167* (2013.01)

(58) Field of Classification Search
  USPC .................................................. 257/139, 302
  See application file for complete search history.

(56) References Cited

U.S. PATENT DOCUMENTS

| | | | |
|---|---|---|---|
| 2007/0120170 A1* | 5/2007 | Niedernostheide | H01L 29/0878 257/302 |
| 2009/0184340 A1 | 7/2009 | Nemoto et al. | |
| 2014/0374793 A1* | 12/2014 | Miyazaki | H01L 21/265 257/139 |

FOREIGN PATENT DOCUMENTS

| | | |
|---|---|---|
| JP | 4128777 B2 | 7/2008 |
| JP | 2009-176892 A | 8/2009 |
| JP | 4571099 B2 | 10/2010 |
| JP | 2012-204612 A | 10/2012 |
| WO | 2013/147274 A1 | 10/2013 |

OTHER PUBLICATIONS

International Search Report; PCT/JP2013/083458 mailed Mar. 18, 2014.

An Office Action; "Notice of Reasons for Rejection"; issued by the Taiwanese Patent Office on Nov. 25, 2015, which corresponds to Taiwanese Patent Application No. 103104017; with partial English language translation.

An Office Action; "Notification of Reason for Rejection," issued by the Japanese Patent Office on Oct. 4, 2016, which corresponds to Japanese Patent Application No. 2015-552265 and is related to U.S. Appl. No. 15/031,623; with partial English language translation.

* cited by examiner

SEMICONDUCTOR DEVICE MANUFACTURING METHOD

TECHNICAL FIELD

The present invention relates to a semiconductor device manufacturing method used for switching of large electricity, for example.

BACKGROUND ART

Patent Literature 1 discloses a punch-through type IGBT (Insulated Gate Bipolar Transistor). This IGBT includes a p+ type semiconductor substrate, an n− type semiconductor layer, and an n+ type semiconductor layer from the back surface side.

PRIOR ART

Patent Literature

Patent Literature 1: Japanese Patent Laid-Open No. 2001-77357

SUMMARY OF INVENTION

Technical Problem

In the technology disclosed in Patent Literature 1, the n+ type semiconductor layer (buffer layer) between a p+ type region and a drift layer interrupts supply of holes from the p+ type region to the drift layer at turn-off of the IGBT, and there is a problem that the supply of the holes to the drift layer is insufficient. If sufficient holes cannot be supplied to the drift layer at the turn-off, there is a problem that oscillation occurs. If impurity concentration of the buffer layer is lowered in order to increase the supply of the holes at the turn-off, there is a problem that a withstand voltage cannot be ensured.

The present invention was made in order to solve the aforementioned problems and has an object to provide a semiconductor device manufacturing method which can supply sufficient holes to the drift layer at the turn-off while the withstand voltage is ensured.

Means for Solving the Problems

According to the present invention, there is provided a semiconductor device manufacturing method including a first step in which, on a first main surface and a second main surface which is a surface opposite to the first main surface of a semiconductor substrate, a first conductivity-type impurity is implanted in the second main surface by using multiple ion implantations of different acceleration energies so as to form a first impurity region on the semiconductor substrate, a second step in which a second conductivity-type impurity is implanted in the second main surface using the acceleration energy lower than the multiple ion implantations, and a second impurity region is formed so that a non-implantation region in which the impurity is not implanted is left between that and the first impurity region in the semiconductor substrate, a heat treatment step in which heat treatment is applied to the semiconductor substrate so that a buffer layer is formed by the first conductivity-type impurity, a collector layer is formed by the second conductivity-type impurity, and a non-diffusion region in which the first conductivity-type impurity and the second conductivity-type impurity do not diffuse are left between the buffer layer and the collector layer, and a step in which a collector electrode in contact with the collector layer is formed.

Other features of the present invention will be made apparent in the following.

Advantageous Effects of Invention

According to the present invention, since the buffer layer is formed by multiple ion implantations of different acceleration energies, the semiconductor device which can supply sufficient holes to the drift layer at the turn-off can be manufactured while the withstand voltage is ensured.

DESCRIPTION OF EMBODIMENTS

A semiconductor device manufacturing method according to an embodiment of the present invention will be described by referring to the attached drawings. The same reference numerals are given to the same or corresponding constituent elements and description might not be repeated in some cases.

Embodiment 1

Figure 1:
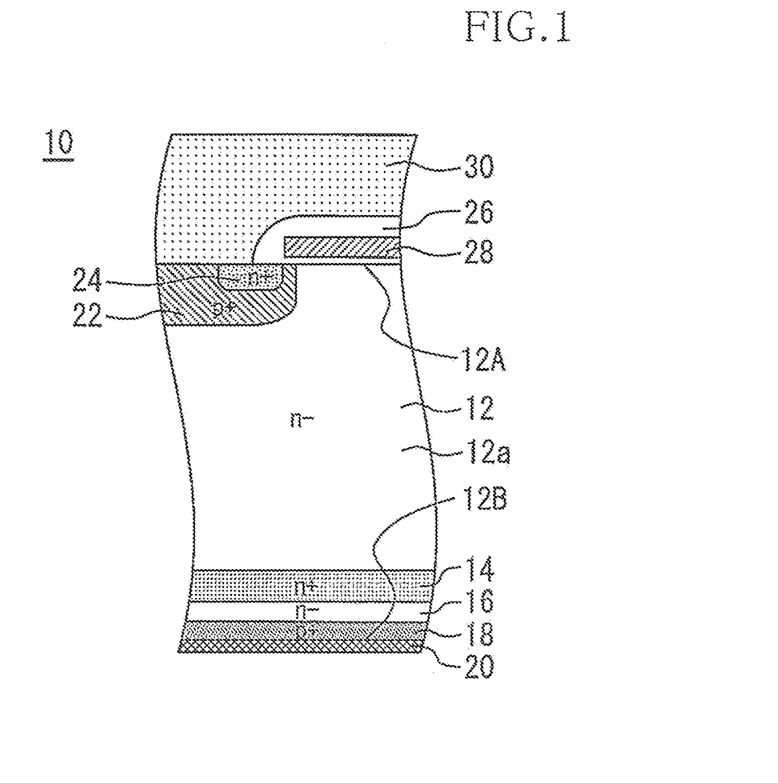
FIG. 1 is a sectional view of a semiconductor device manufactured by the semiconductor device manufacturing method according to Embodiment 1 of the present invention.

FIG. 1 is a sectional view of a semiconductor device 10 manufactured by the semiconductor device manufacturing method according to Embodiment 1 of the present invention. The semiconductor device 10 is a punch-through type IGBT. The semiconductor device 10 includes a semiconductor substrate 12 formed by an n type (hereinafter referred to as a first conductivity type) single-crystal silicon, for example. The semiconductor substrate 12 has a first main surface 12A and a second main surface 12B opposite to the first main surface 12A. On the semiconductor substrate 12, a first conductivity-type drift layer 12a is formed.

On the second main surface 12B side of the semiconductor substrate 12, a first conductivity-type buffer layer 14 in contact with the drift layer 12a is formed. On the second main surface 12B side of the buffer layer 14, there is a non-diffusion region 16. The non-diffusion region 16 has the same impurity concentration as that of the drift layer 12a. On the second main surface 12B side of the non-diffusion region 16, a p type (hereinafter referred to as a second conductivity-type) collector layer 18 is formed. A collector electrode 20 is formed in contact with the collector layer 18.

Figure 2:
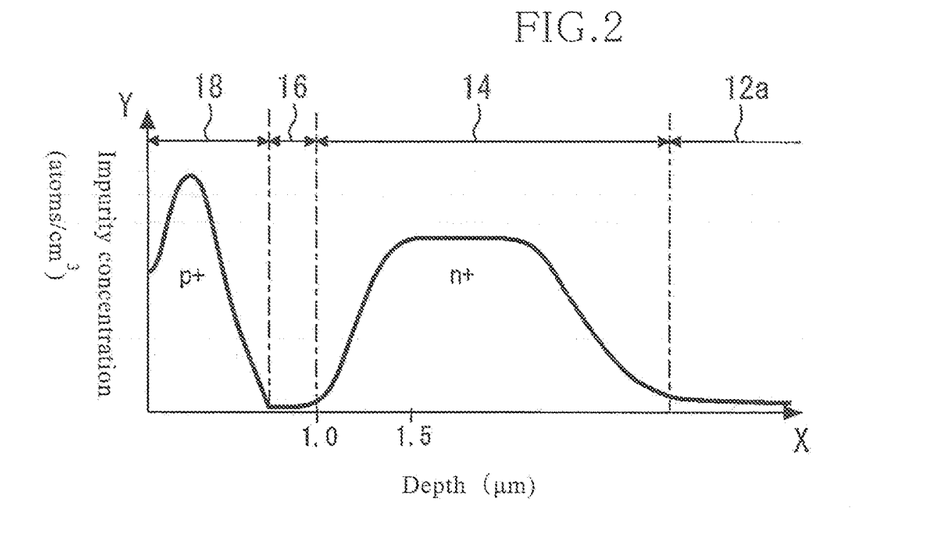
FIG. 2 is a graph illustrating impurity concentrations of the collector layer, the non-diffusion region, the buffer layer, and the drift layer.

On the first main surface 12A side of the semiconductor substrate 12, a second conductivity-type base layer 22 and a first conductivity-type emitter layer 24 surrounded by the base layer 22 are formed. On the first main surface 12A of the semiconductor substrate 12, a gate insulating film 26 and a gate electrode 28 surrounded by the gate insulating film 26 are formed. On the gate insulating film 26, the base layer 22, and the emitter layer 24, an emitter electrode 30 are formed, FIG. 2 is a graph illustrating impurity concentrations of the collector layer 18, the non-diffusion region 16, the buffer layer 14, and the drift layer 12a. In FIG. 2, the second conductivity-type impurity concentrations of the collector layer 18 and the first conductivity-type impurity concentrations of the non-diffusion region 16, the buffer layer 14, and the drift layer 12a are illustrated. The impurity concentration profile of the buffer layer 14 has a trapezoidal shape without a maximum value. The impurity concentration of the non-diffusion region 16 is equal to the impurity concentration of the drift layer 12a.

Figure 3:
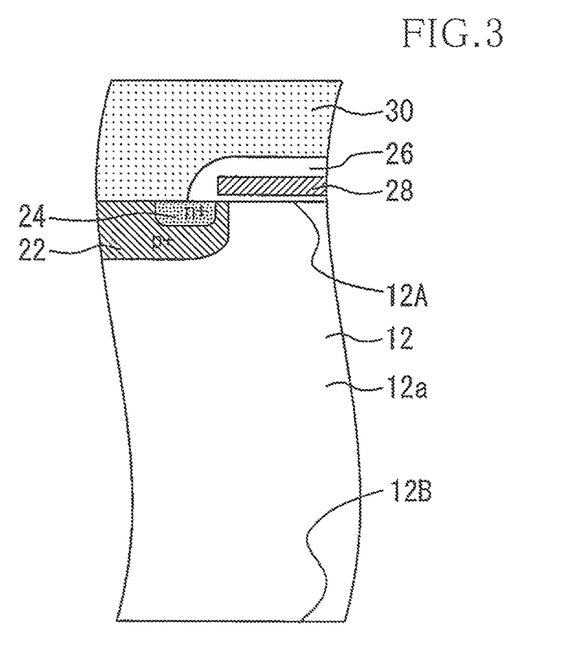
FIG. 3 is a sectional view of the structure on the first main surface side.

The semiconductor device manufacturing method according to Embodiment 1 of the present invention will be described. First, as illustrated in FIG. 3, a structure of the semiconductor substrate 12 on the first main surface 12A side is completed. Subsequently, after a protective tape is bonded to the emitter electrode 30, the semiconductor substrate 12 is ground from the second mains surface 12B side. A thickness of the semiconductor substrate 12 after grinding is assumed to be 100 μm, for example.

Figure 4:
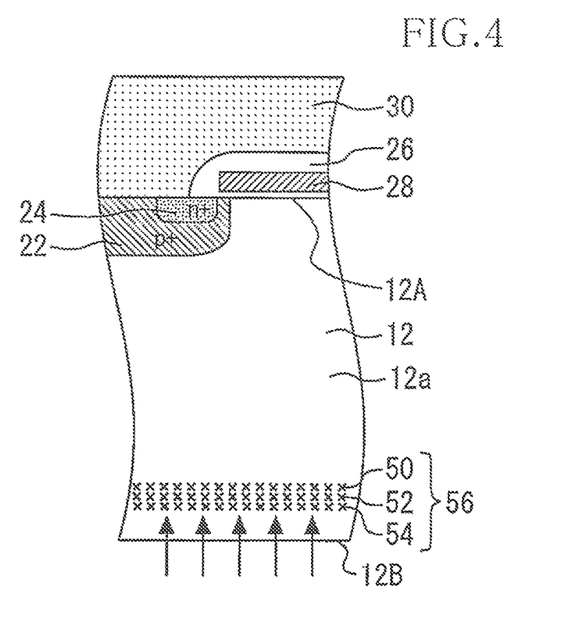
FIG. 4 is a sectional view of the semiconductor substrate for explaining the first step.

Subsequently, in the second main surface 12B of the semiconductor substrate 12, the first conductivity-type impurity is implanted by using multiple ion implantations of different acceleration energies. This step is called a first step. FIG. 4 is a sectional view of the semiconductor substrate for explaining the first step. In the first step, first, a first conductivity-type impurity 50 is implanted at the acceleration energy of 4 MeV. After that, a first-conductivity impurity 52 is implanted closer to the second main surface 12B side than the first conductivity-type impurity 50 at the acceleration energy of 3 MeV. After that, a first conductivity-type impurity 54 is implanted closer to the second main surface 12B side than the first conductivity-type impurity 52 at the acceleration energy of 2 MeV. Arrows in FIG. 4 indicate ion implantation directions. The first conductivity-type impurity 54 implanted at the acceleration energy of 2 MeV reaches a place at approximately 1.5 μm from the second main surface 12B.

Since extremely high acceleration energy is required in the first step as described above, a high-energy ion implanting device is used. Considering fluctuation in impurity distribution caused by crystalline defects after each implantation, the implantation with high acceleration energy is preferably performed first, but the order may be different. The first conductivity-type impurities 50, 52, and 54 are phosphorous (P), for example, but it is not particularly limited as long as it is the first conductivity-type impurity. Dosages of these multiple (three) ion implantations are uniform. Regions in the semiconductor substrate 12 in which the first conductivity-type impurities 50, 52, and 54 are implanted are called a first impurity region 56.

Figure 5:
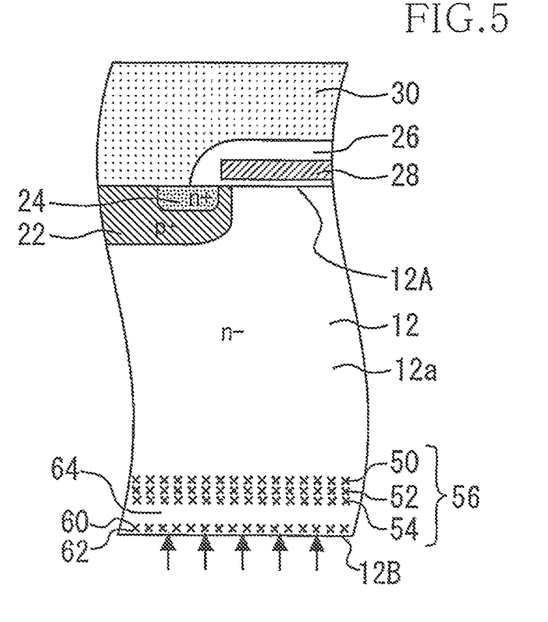
FIG. 5 is a sectional view of the semiconductor substrate for explaining the second step.

Subsequently, the second conductivity-type impurity is ion-implanted in the second main surface 12B of the semiconductor substrate 12 at the acceleration energy lower than the multiple ion implantations described above. This step is called a second step. FIG. 5 is a sectional view of the semiconductor substrate for explaining the second step. In the second step, a second conductivity-type impurity 60 is implanted closer to the second main surface 12B side than the first conductivity-type impurity 54 at the acceleration energy of 100 KeV. Arrows in FIG. 5 indicate the ion implantation direction. The second conductivity-type impurity 60 is B (boron), for example, but is not particularly limited as long as it is the second conductivity-type impurity. A region in the semiconductor substrate 12 in which the second conductivity-type impurity 60 is implanted is called a second impurity region 62.

The first impurity region 56 is formed by ion implantation of the acceleration energy at several MeV, while the second impurity region 62 is formed by ion implantation of the acceleration energy at 100 KeV and thus, a non-implantation region 64 where the impurity is not implanted is left between the first impurity region 56 and the second impurity region 62.

Figure 6:
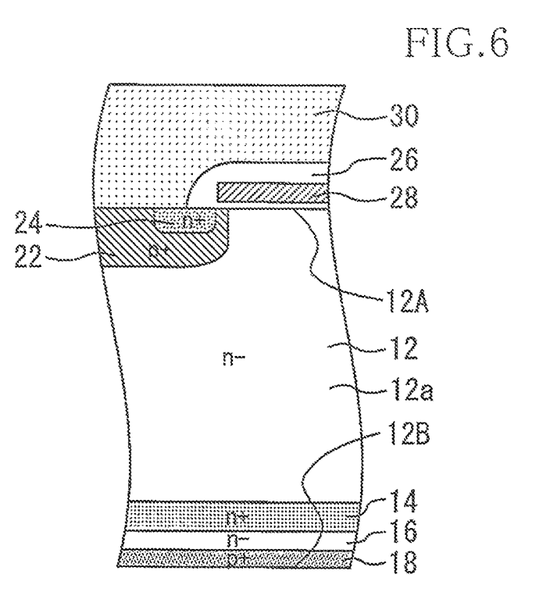
FIG. 6 is a sectional view of the semiconductor substrate after the heat treatment step.

Subsequently, heat treatment is applied to the semiconductor substrate 12. This step is called a heat treatment step. In the heat treatment step, the semiconductor substrate 12 is heated by laser annealing or using an electric oven to approximately 300 to 500° C., for example, and the first conductivity-type impurities 50, 52, 54, and the second conductivity-type impurity 60 are activated. FIG. 6 is a sectional view of the semiconductor substrate 12 after the heat treatment step. By means of the heat treatment step, the buffer layer 14 is formed by the first conductivity-type impurities 50, 52, and 54, and the collector layer 18 is formed by the second conductivity-type impurity 60. At this time, the non-diffusion region 16 where the first conductivity-type impurities 50, 52, 54 and the second conductivity-type impurity 60 do not diffuse is left between the buffer layer 14 and the collector layer 18.

Subsequently, after the second main surface 12B is washed as necessary, the collector electrode 20 in contact with the collector layer 18 is formed. As a result, the semiconductor device 10 illustrated in FIG. 1 is completed. Subsequently, a turn-off operation of this semiconductor device 10 will be described. After the semiconductor device 10 is brought into an ON state, by lowering a positive voltage applied to the gate electrode 28, a channel formed in the periphery of the gate insulating film 26 is lost, and electron implantation from the emitter layer 24 to the drift layer 12a is stopped.

At this time, potential of the buffer layer 14 rises, and a hole supply amount from the collector layer 18 to the drift layer 12a decreases. Then, carriers (electron and hole) accumulated in the drift layer 12a are lost in pairs. Alternatively, the electrons of the drift layer 12a flow to the collector electrode 20 side and are bonded with the holes and lost, or the holes of the drift layer 12a flow from the base layer 22 to the emitter electrode 30 and are bonded with the electrons and lost. When all the carriers in the drift layer 12a are lost, resistance of the drift layer 12a becomes high, and the turn-off is completed.

At the turn-of the semiconductor device 10, a depletion layer extends from the first main surface 12A side toward the buffer layer 14. In order to stop this depletion layer at the buffer layer 14 so as to ensure the withstand voltage, an impurity amount of the buffer layer 14 needs to be sufficiently large. Thus, in Embodiment 1 of the present invention, the impurity amount of the buffer layer 14, that is, the total sum of the dosages in the first step shall be the amount sufficient to stop the depletion layer.

Here, in order to facilitate understanding of the meaning of the manufacturing method of the semiconductor device 10, a comparative example will be described. The semiconductor device manufacturing method of the comparative example is different from the semiconductor device manufacturing method according to Embodiment 1 of the present invention in a point that the first impurity region is formed by one ion implantation of the acceleration energy at 3 MeV in the first step. The dosage of the first conductivity-type impurity in the first step in the comparative example and the total sum of the dosages of the first conductivity-type impurities 50, 52, and 54 in the first step of Embodiment 1 are equal. Therefore, the dosage of three times of that of the first conductivity-type impurity 50 is supplied in one ion implantation in the first step of the comparative example.

Figure 7:
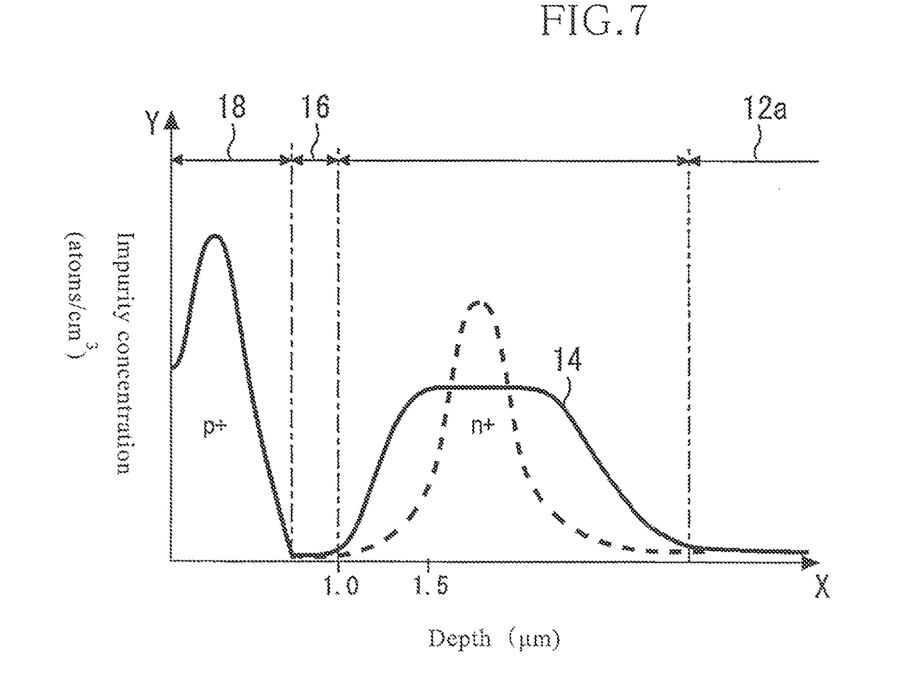
FIG. 7 is a graph illustrating an impurity concentration profile of the buffer layer in the comparative example by a broken line.

FIG. 7 is a graph illustrating an impurity concentration profile of the buffer layer in the comparative example by a broken line. A solid line indicates an impurity concentration profile of the buffer layer 14 in Embodiment 1. In the comparative example, since the first impurity region is formed by one ion implantation, a maximum value of the impurity concentration of the buffer layer is higher than the maximum value of the impurity concentration of the buffer layer 14. Since the buffer layer in the comparative example and the buffer layer 14 have an equal impurity amount (dosage), an area of a portion surrounded by the broken line and the X-axis in FIG. 7 is equal to an area of a portion surrounded by the solid line (buffer layer 14) and the X-axis.

According to the semiconductor device manufacturing method according to Embodiment 1 of the present invention, the semiconductor device which can supply sufficient holes to the drift layer at the turn-off can be manufactured while the withstand voltage is ensured. First, ensuring of the withstand voltage will be described. As described above, since the impurity amount of the buffer layer 14 is an amount sufficient to stop the depletion layer at the turn-off, the withstand voltage of the semiconductor device 10 is ensured.

Subsequently, supply of the sufficient holes to the drift layer at the turn-off will be described. In order to supply the sufficient amount of holes to the drift layer 12a at the turn-off, the maximum value of the impurity concentration of the buffer layer is preferably lowered so that the flow of holes moving from the collector layer 18 to the drift layer 12a is not obstructed by the buffer layer 14. Since the buffer layer 14 of Embodiment 1 of the present invention is formed by applying the heat treatment after multiple ion implantations of different acceleration energies, the impurities are distributed. Therefore, the maximum value of the impurity concentration of the buffer layer 14 can be lowered. Thus, the sufficient amount of holes can be supplied to the drift layer at the turn-off.

The semiconductor device 10 and the semiconductor device manufactured by the manufacturing method of the comparative example will be compared. Since the both have the equal dosages in the buffer layers, the both have equal withstand voltage characteristics. However, while the maximum value of the impurity concentration in the buffer layer 14 is low since it is formed by using the multiple ion implantations of different acceleration energies, the maximum value of the impurity concentration in the buffer layer of the comparative example is high since it is formed by one ion implantation. Therefore, the semiconductor device 10 can supply sufficient holes to the drift layer 12a at the turn-off, but the semiconductor device of the comparative example cannot supply sufficient holes to the drift layer at the turn-off. As described above, according to the semiconductor device manufacturing method according to Embodiment 1 of the present invention, the semiconductor device which can supply the sufficient holes to the drift layer at the turn-off can be manufactured while the withstand pressure is ensured.

The meaning of the non-diffusion region 16 will be described. Since the holes of the collector layer 18 can easily proceeds to the non-diffusion region 16, the non-diffusion region 16 has an effect of promoting hole supply to the drift layer 12a. Therefore, the semiconductor substrate 12 can be made thinner so as to lower a loss. Moreover, if the implanted energy is fluctuated and the collector layer 18 moves to the first main surface 12A side, or if the buffer layer 14 moves to the second main surface 12B side, the non-diffusion region 16 has a function of preventing the collector layer 18 and the buffer layer 14 from brought into contact with each other. By preventing contact between the collector layer 18 and the buffer layer 14 by the non-diffusion region 16, electric characteristics of the semiconductor device 10 can be made stable.

The semiconductor device manufacturing method according to Embodiment 1 of the present invention can be used not only to the aforementioned planar-type IGBT but also to elements with a structure in which an electric current is made to flow between the first main surface and the second main surface of the semiconductor substrate such as a trench-type IGBT or a diode, for example. Moreover, the n type is the first conductivity type and the p type is the second conductivity type, but the semiconductor device 10 may be formed by using the p type as the first conductivity type and the n type as the second conductivity type.

In order to provide the non-implantation region 64 in FIG. 5, the first conductivity-type impurities 50, 52, and 54 need to be implanted with high acceleration energy in the first step. The acceleration energies of the first conductivity-type impurities 50, 52, and 54 are preferably selected within a range from 1 to 10 MeV. In Embodiment 1, acceleration energies of 4, 3, and 2 MeV are selected. It is only necessary that the number of implantation times in the first step is multiple and is not limited to three.

In order to provide the non-implantation region 64 in FIG. 5, the second conductivity-type impurity 60 needs to be implanted at low acceleration energy in the second step. The acceleration energy of the second conductivity-type impurity 60 is preferably selected within a range from 5 to 100 KeV. In Embodiment 1, the acceleration energy of 100 KeV is selected.

In the first step, the first conductivity-type impurities 50, 52, and 54 are preferably implanted in a place as far from the second main surface 12B as possible. Thus, in the first step, the first conductivity-type impurities 50, 52, and 54 may be implanted perpendicularly in the second main surface 12B in the first step so as to intentionally generate channeling. As a result, the first conductivity-type impurities 50, 52, and 54 can be made to reach deep positions of the semiconductor substrate 12.

In the first step, proton may be implanted as the first conductivity-type impurity. Since proton implantation is suitable for introduction of a defect at a position deep in the semiconductor substrate, the non-diffusion region 16 can be provided easily.

Figure 8:
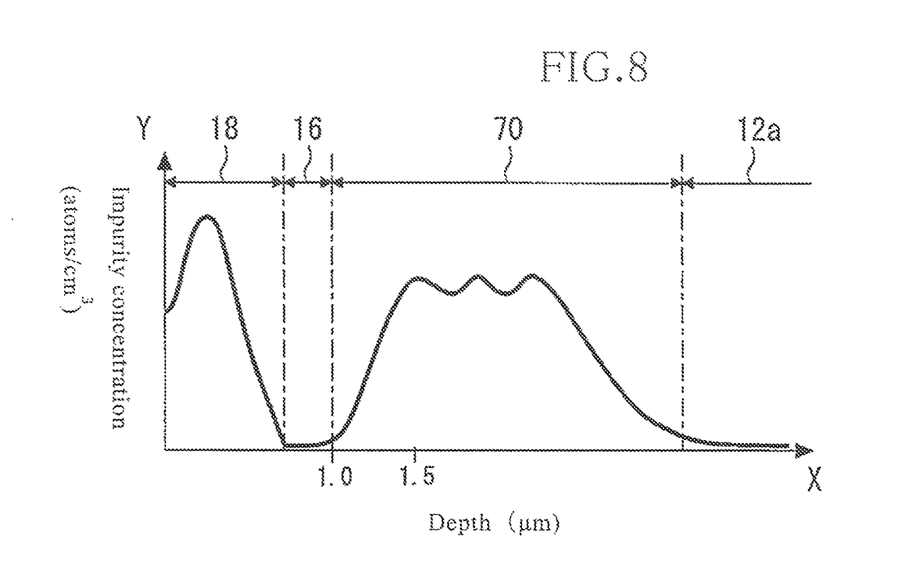
FIG. 8 is a graph illustrating an impurity concentration profile of the buffer layer in the modified example.

The impurity concentration profile of the buffer layer 14 is not limited to the trapezoidal shape of FIG. 2. For example, the impurity concentration profile of a buffer layer 70 illustrated in FIG. 8 can also obtain the aforementioned effect. The maximum value of the impurity concentration of the buffer layer 70 is substantially equal to the maximum value of the impurity concentration of the buffer layer 14 of Embodiment 1. These modifications can be also applied to a semiconductor device manufacturing method according to Embodiment 2.

Embodiment 2

Figure 9:
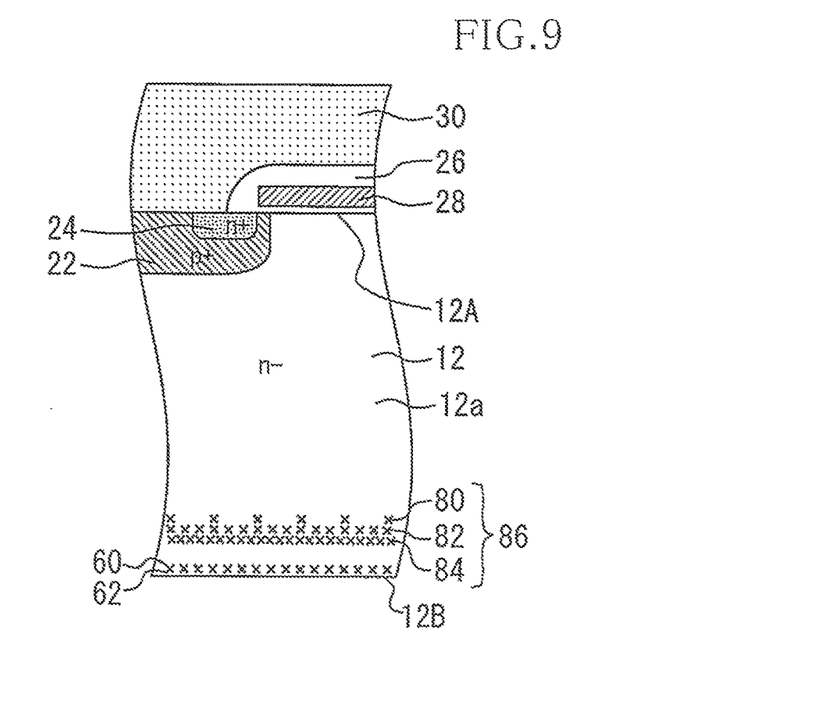
FIG. 9 is a sectional view for explaining a first step of Embodiment 2 of the present invention.

The semiconductor device manufacturing method according to Embodiment 2 of the present invention has many points in common with Embodiment 1 and thus, mainly differences from Embodiment 1 will be described. FIG. 9 is a sectional view for explaining a first step of Embodiment 2 of the present invention. The multiple ion implantations in the first step is made so that the dosage of the first conductivity-type impurity becomes larger as it goes closer to the second main surface 12B side.

Specifically, a first conductivity-type impurity 80 is implanted using the acceleration energy of 4 MeV. Subsequently, a first conductivity-type impurity 82 is implanted using the acceleration energy of 3 MeV so that the dosage thereof becomes larger than the first conductivity-type impurity 80. Subsequently, a first conductivity-type impurity 84 is implanted using the acceleration energy of 2 MeV so that the dosage thereof becomes larger than the first conductivity-type impurity 82.

Figure 10:
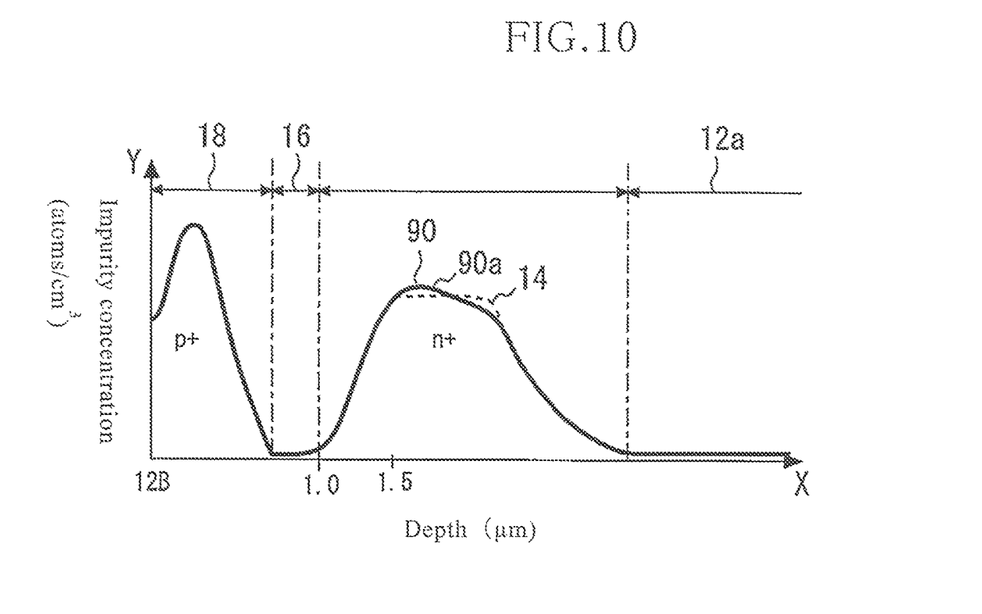
FIG. 10 is a diagram showing impurity concentration profile of the buffer layer.

The dosage of the first conductivity-type impurity 84 is larger than the dosage of the first conductivity-type impurity 82. The dosage of the first conductivity-type impurity 82 is larger than the dosage of the first conductivity-type impurity 80. Then, by applying a heating step, an impurity concentration profile of a buffer layer 90 illustrated by a solid line in FIG. 10 can be obtained. The impurity concentration profile of the buffer layer 90 has an inclination 90a gently rising toward the second main surface 12B. A broken line indicates an impurity concentration profile of the buffer layer 14 in Embodiment 1.

According to the semiconductor device manufacturing method according to Embodiment 2 of the present invention, the effect similar to that of Embodiment 1 can be obtained. Moreover, since the impurity concentration profile of the buffer layer 90 has the inclination 90a illustrated in FIG. 10, electric field intensity of the buffer layer 90 in the turn-off operation is relaxed. That is, if the depletion layer extends from the first main surface 12A side to the buffer layer at the turn off, in the impurity concentration profile of the broken line in FIG. 10, the impurity concentration rapidly rises from the first main surface 12A toward the second main surface 12B, and thus, the electric field can easily concentrate. However, in the buffer layer 90, the impurity concentration rises gently by the inclination 90a, and thus, the electric-field concentration does not occur easily. As a result, a rapid rise of a surge voltage can be suppressed, and oscillation can be reliably suppressed.

DESCRIPTION OF SYMBOLS 10 semiconductor device, 12 semiconductor substrate, 12a drift layer, 12A first main surface. 12B second main surface, 14 buffer layer, 16 non-diffusion region, 18 collector layer, 20 collector electrode, 22 base layer, 24 emitter layer, 26 gate insulating film, 28 gate electrode, 30 emitter electrode, 50,52,54 first conductivity-type impurity, 56 first impurity region, 60 second conductivity-type impurity, 62 second impurity region, 64 non-implantation region, 80,82, 84 first conductivity-type impurity, 90 buffer layer.

The invention claimed is:

1. A semiconductor device manufacturing method comprising:
    a first step in which, on a first main surface and a second main surface, which is a surface opposite to the first main surface of a semiconductor substrate, phosphorous is implanted in the second main surface by using multiple ion implantations of different acceleration energies so as to form a first impurity region on the semiconductor substrate;
    a second step in which a second conductivity-type impurity is implanted in the second main surface using an acceleration energy lower than the multiple ion implantations, and a second impurity region is formed so that a non-implantation region in which the impurity is not implanted is left between that and the first impurity region in the semiconductor substrate;
    a heat treatment step in which heat treatment is applied to the semiconductor substrate so that a buffer layer is formed by the phosphorous, a collector layer is formed by the second conductivity-type impurity, and a non-diffusion region in which the phosphorous and the second conductivity-type impurity do not diffuse is left between the buffer layer and the collector layer; and
    a step in which a collector electrode in contact with the collector layer is formed.

2. The semiconductor device manufacturing method according to claim 1, wherein
    the phosphorous is implanted in the second main surface at the acceleration energy of 1 to 10 MeV; and
    the second conductivity-type impurity is implanted in the second main surface at the acceleration energy of 5 to 100 KeV.

3. The semiconductor device manufacturing method according to claim 1, wherein dosages of the multiple ion implantations are uniform.

4. A semiconductor device manufacturing method comprising:
    a first step in which, on a first main surface and a second main surface, which is a surface opposite to the first main surface of a semiconductor substrate, a first conductivity-type impurity is implanted in the second main surface by using multiple ion implantations of different acceleration energies so as to form a first impurity region on the semiconductor substrate;
    a second step in which a second conductivity-type impurity is implanted in the second main surface using an acceleration energy lower than the multiple ion implantations, and a second impurity region is formed so that a non-implantation region in which the impurity is not implanted is left between that and the first impurity region in the semiconductor substrate;
    a heat treatment step in which a heat treatment is applied to the semiconductor substrate so that a buffer layer is formed by the first conductivity-type impurity, a collector layer is formed by the second conductivity-type impurity, and a non-diffusion region in which the first conductivity-type impurity and the second conductivity-type impurity do not diffuse is left between the buffer layer and the collector layer; and
    a step in which a collector electrode in contact with the collector layer is formed, wherein
    the multiple ion implantations are performed so that the dosage of the first conductivity-type impurity becomes larger as going closer to the second main surface side, and the impurity concentration profile of the buffer layer has only a single peak.

5. The semiconductor device manufacturing method according to claim 4, wherein in the first step, the first conductivity-type impurity is implanted perpendicularly to the second main surface.

6. A semiconductor device manufacturing method comprising:
- a first step in which, on a first main surface and a second main surface, which is a surface opposite to the first main surface of a semiconductor substrate, a first conductivity-type impurity is implanted in the second main surface by using multiple ion implantations of different acceleration energies so as to form a first impurity region on the semiconductor substrate;
- a second step in which a second conductivity-type impurity is implanted in the second main surface using an acceleration energy lower than the multiple ion implantations, and a second impurity region is formed so that a non-implantation region, in which the impurity is not implanted, is left between that the first impurity region in the semiconductor substrate;
- a single heat treatment step in which a heat treatment is applied to the semiconductor substrate to form a buffer layer by the first conductivity-type impurity, a collector layer by the second conductivity-type impurity, and a non-diffusion region in which the first conductivity-type impurity and the second conductivity-type impurity do not diffuse is left between the buffer layer and the collector layer, and
- a step in which a collector electrode in contact with the collector layer is formed.

* * * * *